United States Patent
Wang et al.

(10) Patent No.: US 11,929,441 B2
(45) Date of Patent: Mar. 12, 2024

(54) CONDUCTIVE CONTACT STRUCTURE OF SOLAR CELL, SOLAR MODULE, AND POWER GENERATION SYSTEM

(71) Applicant: Solarlab Aiko Europe GmbH, Freiburg (DE)

(72) Inventors: Yongqian Wang, Yiwu (CN); Wenli Xu, Yiwu (CN); Jianjun Zhang, Yiwu (CN); Jianbo Hong, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/844,709

(22) Filed: Jun. 20, 2022

(65) Prior Publication Data

US 2023/0290893 A1 Sep. 14, 2023

(30) Foreign Application Priority Data

Mar. 11, 2022 (CN) .......................... 202210239253.9

(51) Int. Cl.
*H01L 31/0224* (2006.01)
*H01L 31/05* (2014.01)
*H01L 31/054* (2014.01)

(52) U.S. Cl.
CPC ...... *H01L 31/022425* (2013.01); *H01L 31/05* (2013.01); *H01L 31/0543* (2014.12)

(58) Field of Classification Search
CPC ..... H01L 31/022425; H01L 31/022441; H01L 31/022466; H01L 31/022475; H01L 31/022483
See application file for complete search history.

(56) References Cited

U.S. PATENT DOCUMENTS 3,599,060 A * 8/1971 Triggs ..................... H01L 24/01
257/E21.174
4,941,032 A * 7/1990 Kobayashi ............ H01L 31/075
136/258

(Continued)

FOREIGN PATENT DOCUMENTS

CN 102610664 A 7/2012
CN 109148616 A 1/2019

(Continued)

OTHER PUBLICATIONS

Limodio, et al. IEEE Journal of Photovoltaics, 2020, vol. 10, No. 2, 372-382 (Year: 2020).*

(Continued)

*Primary Examiner* — Sadie White
(74) *Attorney, Agent, or Firm* — MATTHIAS SCHOLL P.C.; Matthias Scholl

(57) ABSTRACT

A conductive contact structure of a solar cell is provided, includes a substrate; a semiconductor region; and an electrode. The semiconductor region is disposed on or in the substrate. The electrode is disposed in the semiconductor region. The electrode includes a seed layer in contact with the semiconductor region. The seed layer includes an alloy material, and includes a main component and an improved component. The main component is one or more metals having an average refractive index lower than 2 and a wavelength in a range of 850-1200 nm, and the improved component includes any one or more of Mo, Ni, Ti, W, Cr, Mn, Pd, Bi, Nb, Ta, Pa, Si, and V.

17 Claims, 2 Drawing Sheets

(56) References Cited

U.S. PATENT DOCUMENTS

| | | | |
|---|---|---|---|
| 5,580,665 A * | 12/1996 | Taguchi | A61N 5/045 |
| | | | 428/548 |
| 2004/0200520 A1* | 10/2004 | Mulligan | H01L 31/022441 |
| | | | 438/98 |
| 2009/0032958 A1* | 2/2009 | Farrar | H01L 23/53219 |
| | | | 438/642 |
| 2014/0090701 A1 | 4/2014 | Rim et al. | |
| 2016/0284885 A1* | 9/2016 | Westerberg | H01L 31/02167 |
| 2016/0380122 A1* | 12/2016 | Woehl | H01L 31/02013 |
| | | | 438/584 |
| 2017/0162722 A1 | 6/2017 | Fu et al. | |
| 2018/0006171 A1* | 1/2018 | Moors | H01L 31/03682 |
| 2018/0219119 A1* | 8/2018 | Masuko | H01L 31/18 |

FOREIGN PATENT DOCUMENTS

| | | |
|---|---|---|
| CN | 111244026 A | 6/2020 |
| JP | 2018049962 A | 3/2018 |
| KR | 20110032655 A | 3/2011 |
| TW | 201442260 A | 11/2014 |

OTHER PUBLICATIONS

Sang Hee Lee et al., Study of Cu-X alloy seed layer on ITO for copper-plated silicon heterojunction solar cells, Materials Science in Semiconductor Processing, Nov. 1, 2018, pp. 19-23, vol. 87, Elsevier, Netherlands.

\* cited by examiner

CONDUCTIVE CONTACT STRUCTURE OF SOLAR CELL, SOLAR MODULE, AND POWER GENERATION SYSTEM

CROSS-REFERENCE TO RELAYED APPLICATIONS

Pursuant to 35 U.S.C. § 119 and the Paris Convention Treaty, this application claims foreign priority to Chinese Patent Application No. 202210239253.9 filed Mar. 11, 2022, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245. First Street, 18th Floor, Cambridge, Mass. 02142.

BACKGROUND

The disclosure relates to the technical field of solar cells, and more particularly, to a conductive contact structure of a solar cell, a solar module, and a power generation system.

In a solar cell, as shown in FIG. 2, a copper layer 100 is generally used as a conductive layer to cover a silicon substrate 200. However, an insufficient bonding force between copper and silicon easily causes the conductive layer to fall off the silicon substrate, and diffusion of the copper in the conductive layer into the silicon substrate reduces performance of the solar cell. In order to resolve the problem, in the prior art, a seed layer 300 is added between the copper conductive layer and the silicon substrate, to enhance the bonding force between the copper conductive layer 100 and the silicon substrate 200. A nickel layer is usually used as the seed layer. Although the nickel layer increases the bonding force between the copper conductive layer and the silicon substrate, an enhancement effect is not ideal, and the nickel layer has a poor reflection effect, which reduces a light trapping effect of the solar cell.

SUMMARY

The disclosure provides a conductive contact structure of a solar cell, a solar module, and a power generation system, to increase a bonding force between a conductive layer and a substrate and enhance a light trapping effect of the solar cell.

To achieve the objective, the disclosure adopts the following technical solutions.

A conductive contact structure of a solar cell is provided, comprising:
  a substrate;
  a semiconductor region; and
  an electrode;
  the semiconductor region is disposed on or in the substrate;
  the electrode is disposed in the semiconductor region;
  the electrode comprises a seed layer in contact with the semiconductor region; and
  the seed layer comprises an alloy material, and comprises a main component and an improved component, the main component is one or more metals having an average refractive index lower than 2 and a wavelength in a range of 850-1200 nm, and the improved component comprises any one or more of Mo, Ni, Ti, W, Cr, Mn, Pd, Bi, Nb, Ta, Pa, Si, and V.

In a class of this embodiment, the main component comprises any one or more of Al, Ag, Cu, and Mg.

In a class of this embodiment, the improved component may further comprise a non-metallic composition.

In a class of this embodiment, a content of the main component is greater than 50 wt. % of the seed layer.

In a class of this embodiment, the main component is Al having a content greater than or equal to 70 wt. % of the seed layer. The improved component is Ni having a content less than or equal to 30 wt. % of the seed layer.

In a class of this embodiment, the main component is Al having a content greater than or equal to 70 wt. % of the seed layer. The improved component is W having a content less than or equal to 30 wt. % of the seed layer.

In a class of this embodiment, the main component is Al having a content greater than or equal to 70 wt. % of the seed layer. The improved component is Ti having a content less than or equal to 30 wt. % of the seed layer.

In a class of this embodiment, the main component is Al having a content greater than or equal to 70 wt. % of the seed layer. The improved component is Mo having a content less than or equal to 30 wt. % of the seed layer.

In a class of this embodiment, the main component is Al having a content greater than or equal to 70 wt. % of the seed layer. The improved component is Cr having a content less than or equal to 30 wt. % of the seed layer. In a class of this embodiment, the main component is Al having a content greater than or equal to 70 wt. % of the seed layer. The improved component is Si having a content less than or equal to 30 wt. % of the seed layer.

In a class of this embodiment, the seed layer is formed on the substrate by using any of manufacturing methods such as physical vapor deposition, screen printing, chemical vapor deposition, electroplating, or chemical plating.

In a class of this embodiment, the electrode further comprises a conductive layer disposed above the seed layer.

In a class of this embodiment, the conductive layer comprises any one or more of Cu, Ag, and Al.

In a class of this embodiment, a passivation film is formed between the seed layer and the semiconductor region. An opening is provided on the passivation film, and the seed layer comes into contact with the semiconductor region through the opening.

In a class of this embodiment, a transparent conductive oxide (TCO) thin film is further disposed between the seed layer and the passivation film, and the TCO thin film comes into contact with the semiconductor region through the opening on the passivation film.

In a class of this embodiment, the TCO thin film is an indium tin oxide or a zinc oxide-based thin film.

In a class of this embodiment, the semiconductor region comprises a tunnel oxide layer and doped polysilicon.

In a class of this embodiment, a method for growing the conductive layer on the seed layer comprises electroplating, physical vapor deposition, screen printing, or chemical plating.

In a class of this embodiment, an upper portion of the conductive layer is covered with a protective layer.

In a class of this embodiment, the protective layer is an Sn layer or an Ag layer.

In a class of this embodiment, the protective layer is grown on the conductive layer by means of electroplating or chemical plating.

In a class of this embodiment, the substrate is a silicon substrate.

In a class of this embodiment, the seed layer is formed by stacking a plurality of sub-seed layers.

In a class of this embodiment, contents of main components in the sub-seed layers stacked along a direction facing away from the substrate gradually decrease.

In a class of this embodiment, a thickness of the seed layer ranges from 10 nm to 1000 nm.

In a class of this embodiment, a thickness of the seed layer ranges from 30 nm to 300 nm.

In a class of this embodiment, a thickness of the conductive layer ranges from 1 μm to 800 μm.

In a class of this embodiment, a thickness of the conductive layer ranges from 1 μm to 100 μm.

The disclosure further provides a solar cell comprising the conductive contact structure.

The disclosure further provides a solar module comprising a plurality of solar cells that are electrically connected to each other.

The disclosure further provides a solar power generation system, comprising a plurality of solar modules that are electrically connected to each other.

According to the disclosure, the seed layer is added between the conductive layer and the substrate. The seed layer comprises an alloy material, and the main component thereof is one or more metals having an average refractive index lower than 2 within the wavelength range of 850-1200 nm, and the improved component is any one or more of Mo, Ni, Ti, W, Cr, Si, Mn, Pd, Bi, Nb, Ta, Pa, or V. The seed layer formed by fusing the main component and the improved component can be tightly bonded to the conductive layer and the substrate. In addition, a light trapping effect of the solar cell is enhanced.

BRIEF DESCRIPTION OF THE DRAWINGS

To describe the technical solutions in the embodiments of the disclosure more clearly, the following briefly describes the accompanying drawings required for describing the embodiments of the disclosure. Obviously, the accompanying drawings in the following descriptions are merely some embodiments of the disclosure, and a person of ordinary skill in the art may further obtain other accompanying drawings according to the accompanying drawings without creative efforts.

DETAILED DESCRIPTION

Figure 1:
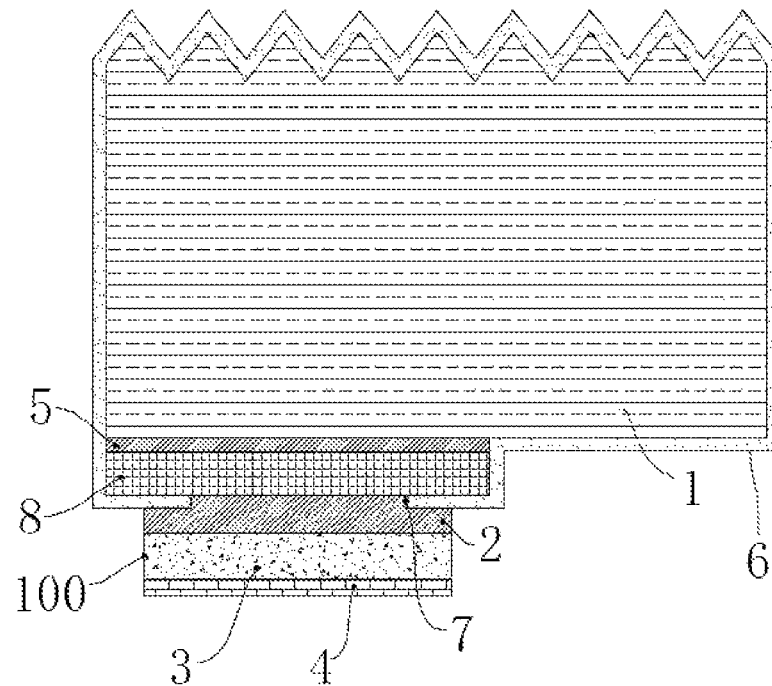
FIG. 1 is a schematic diagram of a conductive contact structure of a solar cell according to an embodiment of the disclosure.
Figure 2:
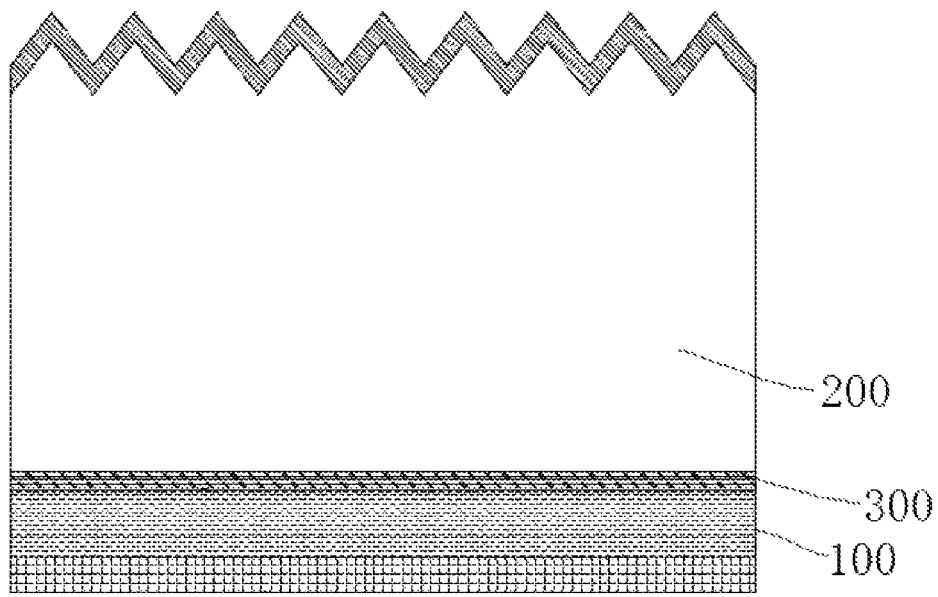
FIG. 2 is a schematic diagram of a conductive contact structure of a solar cell in the prior art.

The technical solutions of the disclosure are further described in detail below with reference to the accompanying drawings and specific implementations.

The accompanying drawings are merely schematic diagrams for exemplary descriptions, are not drawn to scale, and therefore are not intended to be construed as a limitation to the disclosure. To better illustrate the embodiments of the disclosure, some parts in the accompanying drawings may be omitted, enlarged, or reduced, and do not represent the size of an actual product. For a person skilled in the art, some well-known structures and descriptions thereof may be omitted in the accompanying drawings.

The same or similar components are denoted by the same or similar reference numerals in the accompanying drawings of the embodiments of the disclosure. In the description of the disclosure, it should be understood that, orientations or position relationships indicated by terms such as "up", "down", "left", "right", "inside", and "outside" are orientations or position relationships shown based on the accompanying drawings, and are merely used for describing the disclosure and simplifying the description, but are not intended to indicate or imply that the apparatus or element should have a particular orientation or be constructed and operated in a particular orientation. Therefore, the terms used for describing the position relationships are merely used for exemplary descriptions, and cannot be constructed as a limitation to the disclosure. A person of ordinary skill in the art may understand specific meanings of the foregoing terms according to specific situations.

In the description of the disclosure, unless otherwise specified or defined, terms such as "connect" that indicates a connection relationship between components should be understood in a broad sense. For example, the connection may be a fixed connection, a detachable connection, or an integral connection; or the connection may be a mechanical connection or an electrical connection; or the connection may be a direct connection, an indirect connection through an intermediate, or internal communication between two components or an interaction relationship between two components. A person of ordinary skill in the art may understand specific meanings of the foregoing terms in the disclosure according to specific situations.

A conductive contact structure of a solar cell provided in an embodiment of the disclosure is shown in FIG. 1 and comprises a substrate 1.

A semiconductor region is disposed on or in the substrate 1.

An electrode 100 is disposed in the semiconductor region.

The electrode comprises a seed layer 2 in contact with the semiconductor region.

The seed layer 2 comprises an alloy material, and comprises a main component and an improved component. The main component is one or more metals having an average refractive index lower than 2 and a wavelength in a range of 850-1200 nm (preferably any one or more of Al (aluminum), Ag (silver), Cu (copper), or Mg (magnesium)), and the improved component comprises any one or more of Mo (molybdenum), Ti (titanium), W (tungsten), Ni (nickel), Cr, Si, Mn, Pd, Bi, Nb, Ta, Pa, or V. A content of the main component in the seed layer is preferably greater than 50%. More preferably, the main component of the seed layer is Al, having a content greater than or equal to 70 wt. % of the seed layer. The improved component is Ti having a content less than or equal to 30 wt. % of the seed layer, or the main component is Al having a content greater than or equal to 70 wt. % of the seed layer. The improved component is W having a content less than or equal to 30 wt. % of the seed layer, or the main component is Al having a content greater than or equal to 70 wt. % of the seed layer. The improved component is Ti having a content less than or equal to 30 wt. % of the seed layer, or the main component is Al having a content greater than or equal to 70 wt. % of the seed layer. The improved component is Mo having a content less than or equal to 30 wt. % of the seed layer.

Ag paste is currently used as an electrode material in mass-produced crystalline silicon solar cells, and costs of Ag paste account for nearly 30% of costs of Non-silicon Cost of cells. Reducing an amount of Ag or not using the production technology of Ag can effectively reduce production costs of the solar cells. Cu is a desirable substitute for Ag. Compared with Ag, Cu has the following advantages as the conductive material, as shown in the following Table a:

TABLE a

| Metal | Ag | Cu |
|---|---|---|
| Volume resistivity (ohm · cm) | 1.60E−06 | 1.70E−06 |
| Price (yuan/ton) | 5101000 | 70970 |

Figure 3:
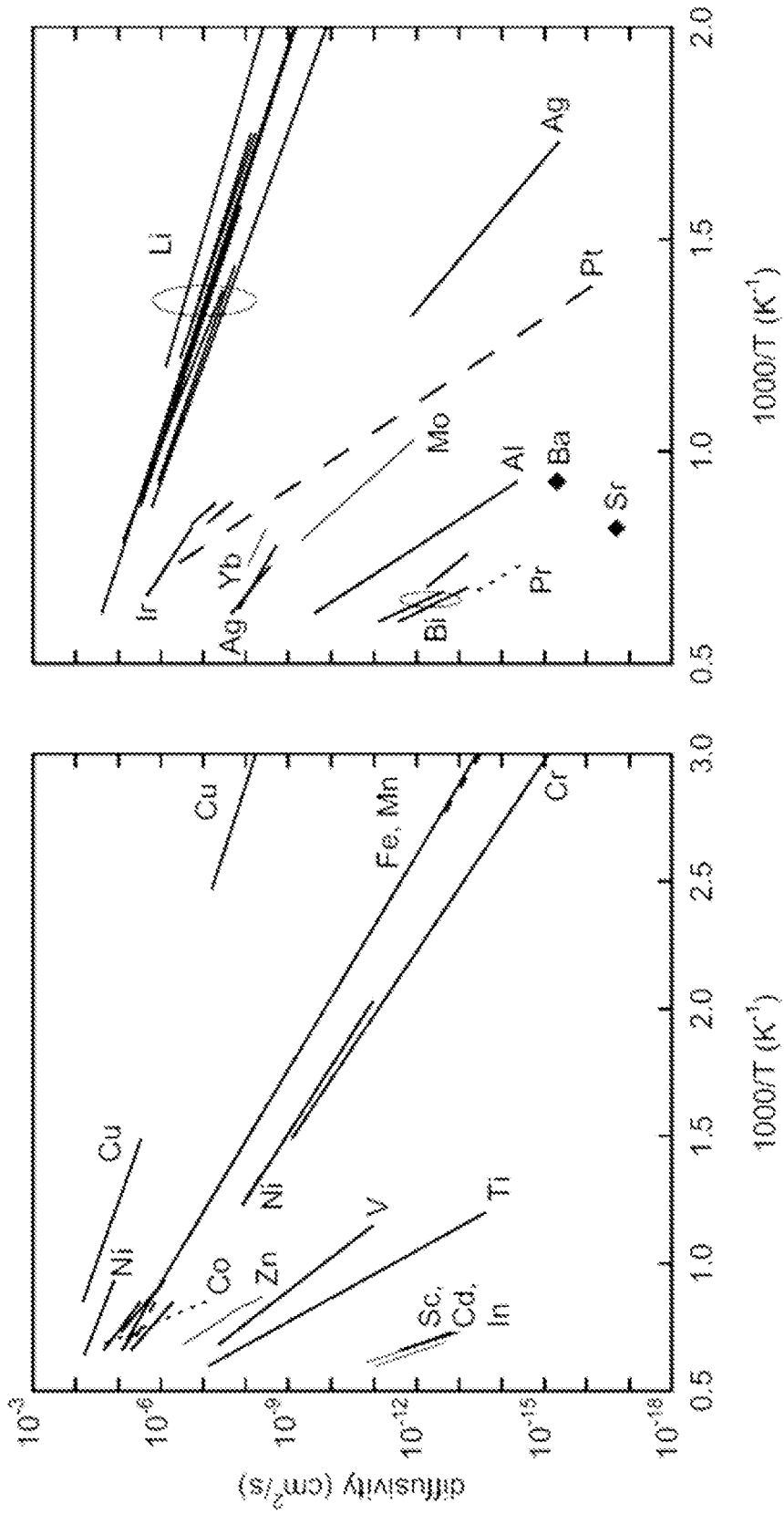
FIG. 3 is a comparison diagram of diffusion coefficients of Cu and other metals.

It may be learned from the above Table a that Cu has relatively stable chemical properties, excellent ductility, and sufficiently low volume resistivity, and a large number of such excellent characteristics are available at low prices (close to 1/72 of a price of Ag). In this way, Cu becomes an effective substitute for Ag. However, Cu has two important characteristics that limit the application in the solar cell. The first characteristic is that Cu has a too large diffusion coefficient. FIG. 3 is a schematic diagram of diffusion coefficients of common metals. Horizontal coordinates and vertical coordinates in FIG. 3 respectively represent reciprocals of temperatures (by Kelvin K) and diffusion coefficients of metal elements. It can be seen from FIG. 3 that the diffusion coefficient of Cu is much higher than that of other metals, and is higher than that of Ag/Al, or the like by 5 orders of magnitude.

The second characteristic is that defects of Cu have a large capture cross-section for a hole, which greatly reduces a bulk lifetime and reduces electrical performance of the solar cell. The impact of the Cu content on the bulk lifetime and the battery performance is shown in Table b below:

TABLE b

| 3 ohm · cm n-type silicon wafer | | |
|---|---|---|
| Cu content (1/cm$^3$) | Bulk lifetime @1E15 | Impact on cell efficiency (%) |
| 0 | 33.25 | — |
| 1.00E+12 | 15.15 | −0.29 |
| 5.00E+12 | 4.48 | −1.35 |
| 1.00E+13 | 2.35 | −2.28 |
| 1.50E+13 | 1.49 | −2.81 |

It can be learned from the Table b that with an increase in the Cu content, the bulk lifetime is greatly reduced, and the cell efficiency is also greatly reduced. Even if there are only 1E12/cm$^3$ of Cu impurities, the cell efficiency is also reduced by 0.29%.

In the prior art, Ni (nickel) is generally used as a barrier layer for diffusion of Cu, and also can well adhere to the substrate and the Cu electrode. The general process of the implementation is: preparing the coated substrate—opening a mould by laser—electroplating Ni—electroplating a Cu layer. However, during our research, it is found that Ni has a major defect as the barrier layer of Cu, that is, a relatively poor long-wavelength reflection effect, which reduces the light trapping effect of the cell and further reduces the conversion efficiency of the cell.

Comparison data of optical properties of the cell using Ni+Cu and Ag as electrode materials is shown in the following Table c:

TABLE c

| | Short-circuit current density of cell ($J_{sc}$/cm$^2$) | |
|---|---|---|
| | Experimental result | Optical simulation result |
| Ag electrode route | 42.09 | 42.12 |
| Ni + Cu | 40.73 | 41.37 |

It can be learned from the above Table c that a combination of Ni+Cu greatly reduces the short-circuit current density of the cell. The simulation results predict that the short-circuit current density is to be decreased by 0.75 mA/cm$^2$, and the experimental result shows that the short-circuit current density is reduced by 1.36 mA/cm$^2$, which is greater than that from theoretical prediction.

Trapping effects of the common metals are analyzed below.

At present, a silicon wafer thickness of the finished cell is about 150 μm, and photon having a wavelength greater than 850 nm can effectively penetrate the thickness. In addition, because a forbidden band width of Si is 1.12 eV, photon having a wavelength greater than 1200 nm is difficult to excite electron-hole pairs. Therefore, mainly 850-1200 nm bands are considered for the light trapping effect. The following Table d shows interface reflectivity of different metals and market prices found in February 2022.

TABLE d

| Material | Simulation result of average reflectivity in the 850-1200 nm bands at an interface between silicon and material (%) | Price (yuan/ton) | Short-circuit current density simulation result (mA/cm$^2$) |
|---|---|---|---|
| Ag | 96.6 | 5,101,000 | 42.18 |
| Al | 80.7 | 22,800 | 42.04 |
| Cu | 91.6 | 70,970 | 42.09 |
| Mg | 80.2 | 50,800 | 41.91 |
| Cr | 22.3 | 67,100 | 41.17 |
| Mo | 33.2 | 370,000 | 41.29 |
| Ni | 38.8 | 180,200 | 41.35 |
| Sn | 51.9 | 339,000 | 41.52 |
| Ti | 18.1 | 80,000 | 41.17 |
| W | 21.6 | 171,500 | 41.20 |

It can be seen from the above Table d that reflectivity among different metals differ greatly. The four metals Ag/Al/Cu/Mg may obtain relatively ideal short-circuit current density results, and are used in the seed layer, so as to achieve the effective light trapping effect. Further analysis is as follows. Cu cannot be used as the seed layer because an important role of the seed layer is to block Cu. The chemical properties of Mg are excessively active, and therefore Mg is not a good choice. Ag is more expensive and is not a good choice either. Al is an ideal seed layer metal, which has an excellent back reflectivity effect, has relatively stable chemical properties, and has a low price that is only 1/223 of Ag and 1/3 of Cu.

However, pure Al used as the seed layer introduces another problem. The adhesion between Al and other metals is weak, the technology of using pure Al as the seed layer may cause product reliability not up to the standard, a case of alternating heat and cold or bending of the product or the stress of a solder joint in the component welding causes the Al to be separated from an external metal, resulting in falling and failure.

The bonding force between Al and Cu is poor, which easily causes fingers to fall in pieces. In order to resolve the problem, various improvement methods have been tried. For example, a contact area of the Al/substrate is increased, a sample is heated to promote intermetallic interdiffusion, a new material such as TiW is added between Al/Cu materials, and the like, and but the effect is not ideal. Finally, it is found that if the improved component that can form good interconnection with Cu is added to the Al material as the seed layer, even additional annealing treatment is not required after Cu is electroplated. That is to say, desirable adhesion of the seed layer/electroplating layer has been formed, which greatly improves the adhesion of the electroplating layer, and eventually solves the problem.

The improved components such as Ni, Mo, Ti, W, Cr, Mn, Pd, Bi, Nb, Ta, Pa, Si, and V obviously enhance the adhesion.

Further, Ni, Mo, Ti, W, Cr, Mn, Pd, Bi, Nb, Ta, Pa, and Si have low reflectivity. If excessive materials are added, the optical performance may be reduced. Using W as an example, it is simply assumed that the property of the alloy composition is an enhanced average value of the composition, and the calculation results shown in the following Table e are obtained.

TABLE e

| W content ratio (%) | Short-circuit current density of cell ($J_{sc}$/cm$^2$) |
| --- | --- |
| 100 | 40.8 |
| 90 | 40.92 |
| 80 | 41.04 |
| 70 | 41.16 |
| 60 | 41.28 |
| 50 | 41.4 |
| 40 | 41.52 |
| 30 | 41.64 |
| 20 | 41.76 |
| 10 | 41.88 |
| 0 | 42.00 |

When the W content is 30%, a current loss is 0.36 mA/cm$^2$, which causes a reduction in cell conversion efficiency by about 0.2%. Although the loss is relatively large, it is acceptable in terms of cost reduction brought about by replacement of Ag by Cu and the solution to the reliability problem. Therefore, it is considered that the improved component less than or equal to 30 wt. % of the seed layer is a recommended value.

Further, improved components in the seed layer may be unevenly distributed, so that better performance can be obtained. The principle is as follows. A part close to the substrate reduces the content of the improved component, which may enhance the reflection of the light, while a part in contact with the metal of the conductive layer may contain a relatively higher content of the improved component, to improve the bonding force with the metal of the conductive layer.

The following Table f shows comparison of welding tension of different electrode technologies.

TABLE f

| Electrode technology | Welding tension (N/mm) |
| --- | --- |
| Conventional Ag electrode | 1.3 |
| Al + Cu electrode | 0.2 |
| Al + TiW + Cu electrode | 0.5 |
| Al alloy + Cu electrode in this patent | 0.6-1.7 (different improved components) |

It can be seen from the above Table f that the pure Al seed layer has relatively low finger tension and is much lower than that of a conventional Ag electrode, while the welding tension is improved after Al and Cu are directly added to the TiW material, but there are still shortcomings. In the disclosure, the solar cell made by using the Al alloy seed layer has even higher welding tension than the conventional Ag electrode.

Al is used as the main component to improve the adhesion between the seed layer and the Cu conductive layer and the light trapping effect of the solar cell. Table g lists data of the technical effects that can be brought by the combination of each single improved component and the main component Al:

TABLE g

| Material of seed layer | | Tension N/mm | Determination as to tension | Cell conversion efficiency (%) | Determination as to efficiency |
| --- | --- | --- | --- | --- | --- |
| Conventional Ag electrode | | 1.3 | / | 25.43 | / |
| Al | | 0.2 | Too low to satisfy reliability requirements | 25.62 | / |
| Al alloy seed layer | W | 1.7 | Significantly improved compared with pure Al | 25.52 | Efficiency loss <0.3%, as expected |
| | Ti | 1.2 | Significantly improved compared with pure Al | 25.47 | Efficiency loss <0.3%, as expected |
| | Mo | 1.4 | Significantly improved compared with pure Al | 25.49 | Efficiency loss <0.3%, as expected |
| | Ni | 1.5 | Significantly improved compared with pure Al | 25.56 | Efficiency loss <0.3%, as expected |
| | Si | 1.1 | Significantly improved compared with pure Al | 25.42 | Efficiency loss <0.3%, as expected |
| | Cr | 0.9 | Significantly improved compared with pure Al | 25.44 | Efficiency loss <0.3%, as expected |
| | Ta | 2.1 | Significantly improved compared with pure Al | 25.39 | Efficiency loss <0.3%, as expected |
| | Mn | 0.7 | Significantly improved compared with pure Al | 25.57 | Efficiency loss <0.3%, as expected |
| | Pd | 0.9 | Significantly improved compared with pure Al | 25.38 | Efficiency loss <0.3%, as expected |
| | Bi | 0.8 | Significantly improved compared with pure Al | 25.47 | Efficiency loss <0.3%, as expected |
| | Nb | 0.6 | Significantly improved compared with pure Al | 25.34 | Efficiency loss <0.3%, as expected |
| | Pa | 1 | Significantly improved compared with pure Al | 25.39 | Efficiency loss <0.3%, as expected |
| | V | 1.7 | Significantly improved compared with pure Al | 25.48 | Efficiency loss <0.3%, as expected |

It may be learned from the above experimental data that Cr, Mn, Pd, Bi, Nb, Ta, Pa, Si, and V as improved components can also improve the adhesion between the seed layer and the Cu conductive layer and the light trapping effect of the solar cell. It should be emphasized that there are hundreds of combinations of any one or more of the improved components Mo, Ni, Ti, W, Cr, Mn, Pd, Bi, Nb, Ta, Pa, Si, and V combined with Al, and it is impossible for us to provide experimental comparative data for all compositions. Therefore, on the premise that the experimental data of Ni, Mo, Ti, W, Cr, Mn, Pd, Bi, Nb, Ta, Pa, Si, and V as individual improved components are given in the specific implementation, it is obvious that other improved components combined with the main component Al can also achieve the desired technical effect.

Further, a thickness of the seed layer is preferably greater than or equal to 30 nm. It is found by experiments that the seed layer having the thickness of 30 nm is sufficient to prevent the diffusion of the Cu metal. For the thickness less than or equal to 300 nm, the main consideration is to control the cost. For example, the seed layer is made by physical vapor deposition. Even if Al is cheaper than other metals, the cost impact of the Al target material still cannot be ignored. Besides, a larger thickness of the seed layer leads to lower production capacity on the device side, which is not conducive to the promotion of mass production. Therefore, the thickness of the seed layer is preferably between 30 nm and 300 nm.

Further, in order to save the costs of the alloy target material and further limit the diffusion of Cu to the substrate, a transparent conductive oxide (TCO) layer may be added between the alloy seed layer and the substrate, and light in a long-wavelength band can pass through the TCO layer and can be effectively reflected at the interface of the alloy layer. In this way, ideal performance and reliability results can also be obtained.

In the foregoing solution, the seed layer is preferably formed on the substrate by using any of manufacturing methods such as the physical vapor deposition (comprising sputtering and evaporation), screen printing, chemical vapor deposition, electroplating, or chemical plating. The seed layer is preferably formed by stacking a plurality of sub-seed layers. More preferably, contents of main components in the sub-seed layers stacked along a direction facing away from the substrate gradually decrease. A high content of the main component in the sub-seed layer at a small distance from the substrate can enhance the reflective effect, thereby improving the light-trapping effect of the solar cell. The sub-seed layer at a large distance from the substrate (closer to the conductive layer) has a high content of the improved component and a relatively low content of the main component, which can ensure the bonding force between the sub-seed layer and the conductive layer.

The thickness of the seed layer is preferably between 10 nm and 1000 nm, and more preferably, the thickness of the seed layer ranges from 30 nm to 300 nm.

The electrode provided in this embodiment is shown in FIG. 1, and further comprises a conductive layer 3 disposed above the seed layer 2. The material for making the conductive layer 3 comprises any one or more of Cu, Ag, and Al. A method for growing the conductive layer on the seed layer comprises electroplating, physical vapor deposition, screen printing, or chemical plating. The thickness of the conductive layer is preferably in a range of 1-800 μm, and more preferably, the thickness of the conductive layer ranges from 1 μm to 100 μm.

In order to protect the conductive layer, preferably, an upper portion of the conductive layer is covered with a protective layer 4. More preferably, the protective layer 4 is an Sn layer or an Ag layer. The protective layer 4 is preferably grown on the conductive layer 3 by electroplating or chemical plating.

As shown in FIG. 1, a passivation film 6 configured to protect the seed layer 2 is preferably formed between the seed layer 2 and the semiconductor region, an opening 7 is provided on the passivation film 6, and the seed layer 2 comes into contact with the semiconductor region through the opening. More preferably, a TCO thin film is further disposed between the seed layer 2 and the passivation film 6, and the TCO thin film comes into contact with the semiconductor region through the opening on the passivation film. The semiconductor region then preferably comprises a tunnel oxide layer 5 and doped polysilicon 8.

Based on the above, according to the disclosure, the seed layer is added between the conductive layer and the substrate. The seed layer comprises an alloy material, and the main component thereof is one or more metals having an average refractive index lower than 2 within the wavelength range of 850-1200 nm, and the improved component is any one or more of Mo, Ni, Ti, W, Cr, Si, Mn, Pd, Bi, Nb, Ta, Pa, or V. The seed layer formed by fusing the main component and the improved component can be tightly bonded to the conductive layer and the substrate. In addition, a light trapping effect of the solar cell is enhanced.

An embodiment of the disclosure further provides a solar cell. The solar cell comprises the above conductive contact structure.

An embodiment of the disclosure further provides a solar module, comprising a plurality of solar cells having the above conductive contact structure that are electrically connected to each other.

An embodiment of the disclosure further provides a solar power generation system, comprising a plurality of solar modules that are electrically connected to each other.

It should be noted that, the foregoing specific embodiments are merely exemplary embodiments of the disclosure and descriptions of the applied technical principles. A person skilled in the art may understand that various modifications, equivalent replacements, and changes may be made to the disclosure. However, such changes without departing from the spirit of the disclosure shall all fall within the protection scope of the disclosure. In addition, terms used in this specification and claims of this application are not limitative, but are merely used for convenience of description.

What is claimed is:

1. A conductive contact structure of a solar cell, the conductive contact structure comprising:
   a substrate;
   a semiconductor region; and
   an electrode;
   wherein:
   the semiconductor region is disposed on or in the substrate;
   the electrode is disposed on the semiconductor region;
   the electrode comprises:
   a seed layer in contact with the semiconductor region, wherein the seed layer comprises an alloy material, which comprises a first component and a second component, wherein:
   the first component is Al in an amount greater than or equal to 70 wt. % of the seed layer; and
   the second component comprises any one or more of Mo, Ti, and W in an amount less than or equal to 30 wt. % of the seed layer; and
   a conductive layer comprising Cu disposed above the seed layer.

2. The conductive contact structure of a solar cell according to claim 1, wherein the second component further comprises a non-metallic composition.

3. The conductive contact structure of a solar cell according to claim 1, wherein a passivation film is formed between the seed layer and the semiconductor region; and an opening is provided on the passivation film, and the seed layer comes into contact with the semiconductor region through the opening.

4. The conductive contact structure of a solar cell according to claim 3, wherein a transparent conductive oxide (TCO) thin film is further disposed between the seed layer and the passivation film, and the TCO thin film comes into contact with the semiconductor region through the opening on the passivation film.

5. The conductive contact structure of a solar cell according to claim 4, wherein the TCO thin film is an indium tin oxide or a zinc oxide-based thin film.

6. The conductive contact structure of a solar cell according to claim 1, wherein the semiconductor region comprises a tunnel oxide layer and doped polysilicon.

7. The conductive contact structure of a solar cell according to claim 1, wherein a protective layer covers the conductive layer.

8. The conductive contact structure of a solar cell according to claim 7, wherein the protective layer is an Sn layer or an Ag layer.

9. The conductive contact structure of a solar cell according to claim 1, wherein the substrate is a silicon substrate.

10. The conductive contact structure of a solar cell according to claim 9, wherein contents of the first component in sub-seed layers of the seed layer decrease along a direction facing away from the substrate.

11. The conductive contact structure of a solar cell according to claim 9, wherein a thickness of the seed layer ranges from 10 nm to 1000 nm.

12. The conductive contact structure of a solar cell according to claim 9, wherein a thickness of the seed layer ranges from 30 nm to 300 nm.

13. The conductive contact structure of a solar cell according to claim 1, wherein a thickness of the conductive layer ranges from 1 μm to 800 μm.

14. The conductive contact structure of a solar cell according to claim 1, wherein a thickness of the conductive layer ranges from 1 μm to 100 μm.

15. A solar cell, comprising the conductive contact structure according to claim 1.

16. A solar module, comprising a plurality of solar cells according to claim 15 that are electrically connected to each other.

17. A conductive contact structure of a solar cell, the conductive contact structure comprising:
- a substrate;
- a semiconductor region;
- an electrode; and
- a passivation film, the passivation film comprising an opening;

wherein:
- the semiconductor region is disposed on the substrate, and the semiconductor region comprises a tunnel oxide layer and doped polysilicon;
- the electrode is disposed on the semiconductor region;
- the electrode comprises a bottom layer and an upper layer, wherein the bottom layer is a seed layer and the upper layer is a conductive layer, and the conductive layer comprises Cu and is disposed on a top surface of the seed layer;
- the seed layer comprises an alloy material;
- the alloy material comprises a first component and a second component;
- the first component is Al in an amount greater than or equal to 70 wt. % of the seed layer;
- the second component comprises any one or more of Mo, Ti, and W in an amount less than or equal to 30 wt. % of the seed layer;
- the tunnel oxide layer is disposed on the substrate, and the doped polysilicon is disposed on the tunnel oxide layer;
- the passivation film covers side walls of the tunnel oxide layer and the doped polysilicon and a part of a top surface of the doped polysilicon;
- the opening is disposed on the top surface of the doped polysilicon; and
- a bottom of the seed layer is only in connection to the passivation film and the doped polysilicon, and a connection between the bottom of the seed layer and the doped polysilicon is through the opening.

* * * * *